United States Patent [19]

Kai et al.

[11] Patent Number: 4,653,008
[45] Date of Patent: Mar. 24, 1987

[54] METHOD OF CONTROLLING PLATEMAKING POSITIONS AND ERRORS

[75] Inventors: Masanori Kai; Satoshi Hisabayashi, both of Hachiouji; Seiichi Homma, Hino; Yousuke Igarashi, Tachikawa, all of Japan

[73] Assignee: Iwatsu Electric Co., Ltd., Tokyo, Japan

[21] Appl. No.: 743,553

[22] Filed: Jun. 11, 1985

[30] Foreign Application Priority Data

Jun. 21, 1984 [JP] Japan .................................. 59-126394
Jun. 21, 1984 [JP] Japan .................................. 59-126396

[51] Int. Cl.$^4$ .......................... G06F 15/46; B65H 7/02
[52] U.S. Cl. ..................................... 364/471; 364/559;
271/227; 271/261; 355/14 SH; 250/561;
356/400
[58] Field of Search ............... 364/468, 469, 471, 559;
271/227, 258, 259, 261, 265; 355/3 SH, 14 SH;
356/399, 400; 250/559, 560, 561

[56] References Cited

U.S. PATENT DOCUMENTS

| 3,603,446 | 9/1971 | Maxey et al. ........................ 271/227 |
| 3,741,357 | 6/1973 | Krysiuk et al. ...................... 271/227 |
| 4,310,236 | 1/1982 | Conin .................................... 271/227 |
| 4,334,759 | 6/1982 | Clausing ......................... 355/14 SH |
| 4,416,534 | 11/1983 | Kluger ............................ 355/14 SH |
| 4,438,917 | 3/1984 | Janssen et al. ...................... 271/227 |
| 4,455,018 | 6/1984 | Colglazier et al. ................. 271/227 |
| 4,511,242 | 4/1985 | Ashbee et al. ....................... 271/227 |
| 4,519,700 | 5/1985 | Barker et al. .................... 355/14 SH |
| 4,538,905 | 9/1985 | Griego ............................. 355/14 SH |

Primary Examiner—Jerry Smith
Assistant Examiner—John R. Lastova
Attorney, Agent, or Firm—Townsend & Townsend

[57] ABSTRACT

A method of controlling a position of a plate material sheet in a platemaking machine for feeding the plate material sheet in an exposure region and forming a document image on the plate material sheet. A plate material sheet length sensor detects that the plate material sheet to be fed to the exposure region has passed by the sensor. The overall length of the plate material sheet is calculated in accordance with the number of pulses supplied to a plate material sheet drive motor while the plate material sheet length sensor generates an output. Also calculated is a first predetermined number of pulses to be supplied to the plate material sheet drive motor so as to feed the plate material sheet by a first predetermined length within the exposure region. A stop sensor detects a front edge of the plate material sheet, the stop sensor being arranged such that a center thereof is aligned with the axis of the optical system; and the first predetermined number of pulses is supplied to the plate material sheet drive motor after the stop sensor generates an output, so that a center of a first portion of the plate material sheet is aligned with the axis of the optical system.

7 Claims, 21 Drawing Figures

METHOD OF CONTROLLING PLATEMAKING POSITIONS AND ERRORS

BACKGROUND OF THE INVENTION

The present invention relates to a method of controlling a platemaking position and errors and, more particularly, to a method of controlling a position of master paper such that the center of the master paper is aligned with an optical axis of an optical system when an original image is to be formed on the master paper and electrically correcting mechanism errors when the master paper is moved by a stepper motor.

Conventional exposure apparatuses frequently fail to form an original image at a predetermined position when the center of the plate material sheet or master paper is aligned with the axis of the optical system and an original image is formed at the central portion or a predetermined portion of the plate material sheet.

In order to prevent an error from occurring, conventionally, the plate material sheet is stopped at the exposure portion in accordance with a nominal size thereof. However, an error occurs between the nominal size and the actual size thereof, and the image cannot be accurately formed at a predetermined position.

Furthermore, mechanical errors also prevent the formation of the document image at the proper position of the plate material sheet. Conventionally, a stepper motor is used to control the position of the plate material sheet or the like. When dimensional errors occur in drive force transmission members such as pulleys and gears, assembly errors occur in the finished mechanisms. In order to eliminate such errors, there is conventionally provided a mechanical adjustment mechanism or a digital switch for calculating and supplying correction values to a control circuit so as to electrically correct the mechanical errors. However, this mechanical adjustment mechanism results in a complicated construction. The digital switch requires an installation space and results in a large size and increased cost. In addition, correction values must be manually calculated, which is time-consuming.

SUMMARY OF THE INVENTION

It is a principal object of the present invention to provide a method of controlling a position of a plate material sheet in a platemaking machine.

It is another object of the present invention to provide a method of controlling mechanical errors in a platemaking machine.

According to an aspect of the present invention, there is provided a method of controlling a position of a plate material sheet in a platemaking machine for feeding the plate material sheet in an exposure region and forming a document image on the plate material sheet, comprising the steps of:

causing a plate material sheet length sensor to detect that the plate material sheet to be fed to the exposure region has passed thereby;

calculating an overall length of the plate material sheet in accordance with the number of pulses supplied to a plate material sheet drive motor while the plate material sheet length sensor generates an output;

calculating a first predetermined number of pulses to be supplied to the plate material sheet drive motor so as to feed the plate material sheet by a first predetermined length within the exposure region;

causing a stop sensor to detect a front edge of the plate material sheet, the stop sensor being arranged such that a center thereof is aligned with the axis of the optical system; and supplying the first predetermined number of pulses to the plate material sheet drive motor after the stop sensor generates an output, thereby aligning a center of a first portion of the plate material sheet with the axis of the optical system.

According to another aspect of the present invention, there is provided a method of controlling mechanical errors in a platemaking machine, comprising the steps of:

setting reference data used in a control circuit in the platemaking machine to actuate the platemaking machine in accordance with the reference data;

obtaining actually measured values corresponding to the reference data in accordance with a plate manufactured upon actuation of the platemaking machine;

entering the actually measured values in the control circuit and comparing the actually measured values with the reference data; and updating the reference data in accordance with the comparison operation when errors occur.

BRIEF DESCRIPTION OF THE DRAWINGS

FIGS. 1 to 13 show an embodiment of the present invention, in which

FIG. 1 is a sectional view of a platemaking apparatus,

FIG. 7 is a block diagram showing an electric circuit for the exposure unit shown in FIGS. 2A and 2B, and FIGS. 8A and 8B and FIGS. 9 to 13 are respectively flow charts for explaining the operation of the exposure device shown in FIGS. 2A and 2B.

DESCRIPTION OF THE PREFERRED EMBODIMENT

The present invention will be described in detail with reference to a preferred embodiment in conjunction with the accompanying drawings.

Figure 1:
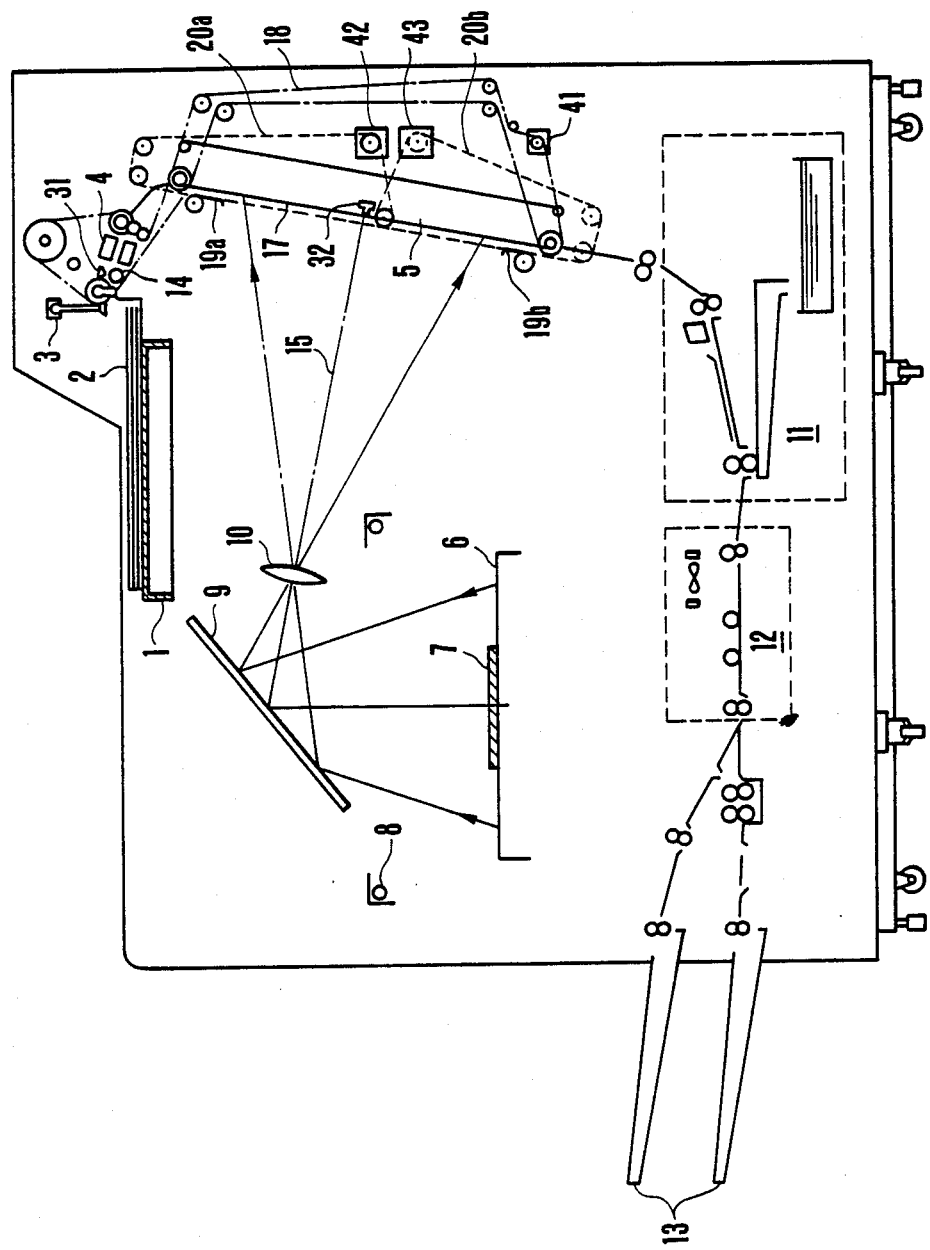

FIG. 1 is a side sectional view showing the overall configuration of a platemaking apparatus. Plate material sheets (i.e., master paper) 2 placed on a paper feed table 1 are fed one by one by a suction mechanism 3. The sheet is charged with a high voltage by a charger 4 while the sheet is being fed by rollers. The sheet is then fed to an exposure unit 5 which is evacuated to a negative pressure.

A document 7 placed on a document table 6 movable along the lateral direction is illuminated by a lamp 8 located above the peripheral portion of the document table 6. An image from the document is picked up by an image pickup lens 10 through a mirror 9 and projected on the exposure unit 5, thereby exposing the plate material sheet 2.

The exposed plate material sheet 2 is fed to a developing unit 11 by rollers. The latent image on the plate material sheet 2 is developed, and the plate material sheet 2 passes through a fixing unit 12. The visible image of the plate material sheet 2 is fixed, and the sheet is dried. The resultant sheet is delivered as a press plate to a delivery table 13.

A photoelectric plate material length sensor (to be referred to as an MLS hereinafter) 31 is arranged between the paper feed table 1 and the exposure unit 5. An overall length of the plate material sheet 2 is detected in accordance with detection thereof and the rotational speed of a roller 14. A photoelectric stop sensor (to be referred to as an STS hereinafter) 32 is arranged at a position aligned with an optical axis 15 of the exposure unit 5. The STS 32 detects a leading edge of the plate material sheet 2 and determines a distance for which the plate material sheet 2 is further fed.

A stepper motor (to be referred to as SM1 hereinafter) 41 is arranged for driving rollers through conveyor belts 17 having a number of vent holes and chains 18. The belts 17 and chains 18 are mounted in the exposure unit 5. Stepper motors (to be referred to as SM2 and SM3 hereinafter) 42 and 43 are arranged to drive upper and lower shielding curtains (to be referred to as BDA and BDB hereinafter) 19a and 19b through wires 20a and 20b, respectively. The rotational speeds of the BDA 19a and the BDB 19b are controlled in response to the number of drive pulses supplied to the SM2 42 and the SM3 43, respectively. The feeding state of the plate material sheet 2 and the spreading states of the BDA 19b and the BDB 19a are thus controlled.

Figure 2A:
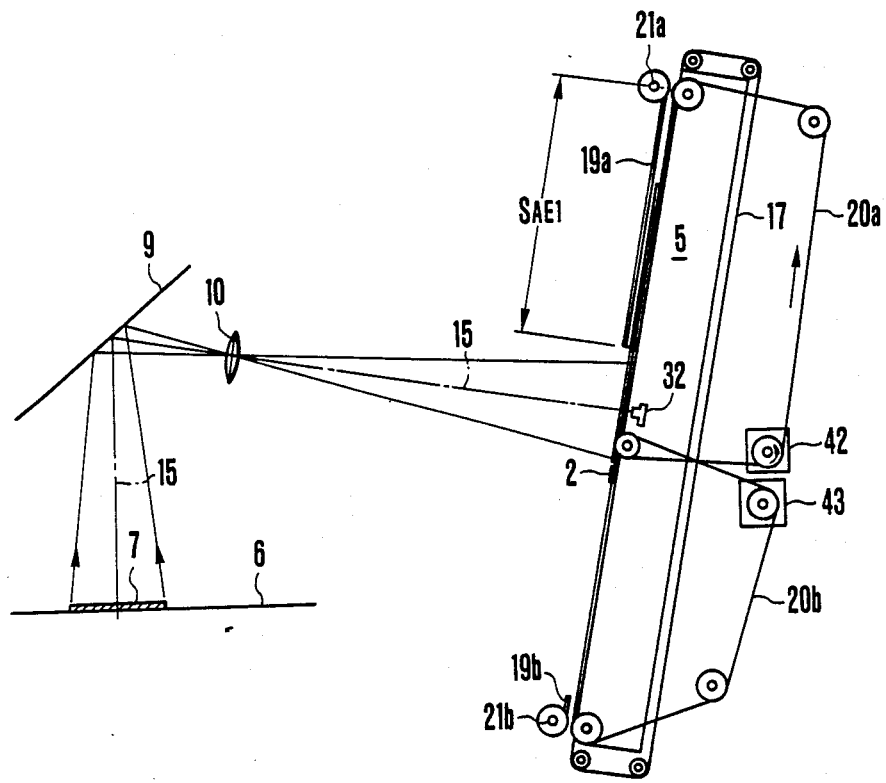
FIGS. 2A and 2B are respectively side views showing different operating states of an exposure unit of the apparatus of FIG. 1, FIGS. 3A, 3B, 4A, 4B, 5A–5C, and 6A–6C are respectively schematic views showing the relationship between the document and the plate material.
Figure 2B:
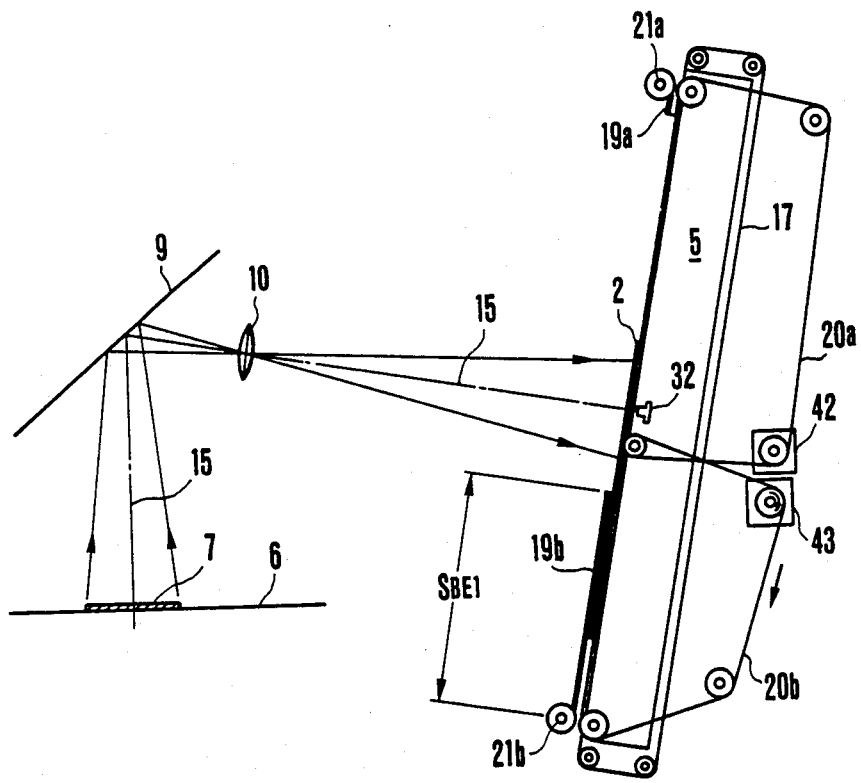

FIGS. 2A and 2B are views for explaining double exposure wherein an identical image is formed at different regions of the common plate material sheet. As shown in FIG. 2A, the document 7 is placed on the document table 6 such that the center of the document 7 is aligned with the optical axis 15. At the same time, the center of the exposure region for the first exposure is aligned with the optical axis 15. The plate material sheet 2 is positioned to satisfy the above requirements. The BDA 19a is extended by the SM2 42 for a length SAE1 along the direction of the arrow with respect to a take-up shaft 21a of the BDA 19a located above the exposure unit 5, thereby masking the nonexposure region of the plate material sheet 2 with the BDA 19a. Under this condition, the first exposure operation is performed to form a first document image in a leading region of the plate material sheet 2.

As shown in FIG. 2B, the plate material sheet 2 is moved by the SM1 41 downward until the center of the exposure region for the second exposure operation is aligned with the optical axis 15 while the document 7 is left unmoved. At the same time, the BDB 19b is extended by the SM3 43 for a length SBE1 along the direction of the arrow with respect to a take-up shaft 21b of the BDB 19b located below the exposure unit 5. Under this condition, the second exposure operation is performed to form a second document image in a trailing region of the plate material sheet 2.

The BDA 19a and the BDB 19b comprise a flexible light-shielding material. The proximal portions of the BDA 19a and the BDB 19b are biased by the corresponding springs and wound around the shafts 21a and 21b, and the distal ends thereof are locked by the wires 20a and 20b, respectively. The BDA 19a and BDB 19b are pulled upon operation of the SM2 42 and the SM3 43 and are stopped upon DC energization of the SM2 42 and the SM3 43, respectively. When the BDA 19a and the BDB 19b are unlocked, they are automatically wound around the shafts 21a and 21b.

Without moving the document 7, multiple platemaking is performed. At the same time, unnecessary light scattering can be prevented by the BDA 19a and the BDB 19b.

Figure 3A:
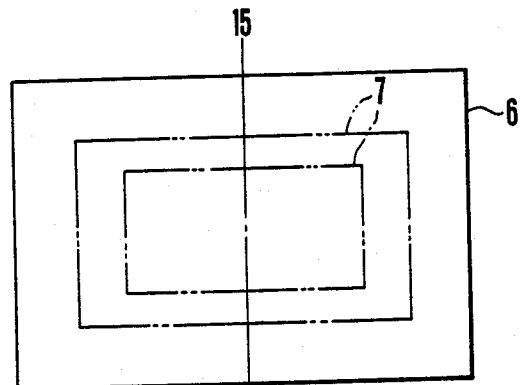
Figure 3B:
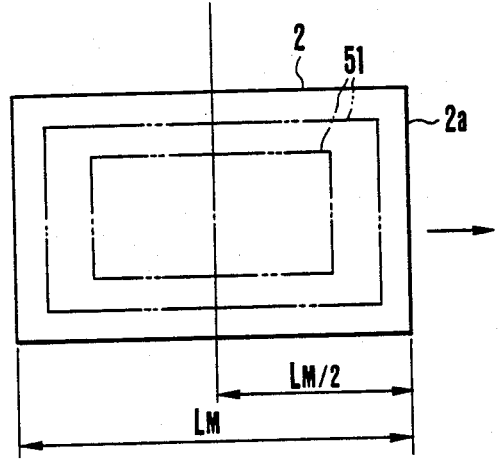

FIGS. 3A and 3B show a relationship between the document 7 and the plate material sheet 2 when exposure is performed under the condition wherein the optical axis 15 is aligned with the center of the plate material sheet 2. Referring to FIG. 3A, the optical axis 15 is aligned with the center of the document. At the same time, as shown in FIG. 3B, an overall length LM of the plate material sheet 2 is measured. When the leading edge 2a of the plate material sheet 2 being fed along the direction of the arrow is aligned with the optical axis 15 of the exposure unit 5, the plate material sheet 2 is further fed by a distance LM/2 and is stopped. When the plate material sheet 2 is thus exposed, a document image 51 can be accurately formed at the central portion of the plate material sheet 2 in accordance with the actual overall length LM thereof.

If a feed length of the plate material sheet 2 driven by the roller 14 in response to one pulse supplied to the SM1 41 is defined as LSR and the number of pulses supplied to the SM1 41 during which the MLS 31 generates an output is defined as N, the overall length LM of the plate material sheet 2 is given as follows:

$$LM = N \times LSR \tag{1}$$

If a feed length of the plate material sheet 2 driven by the belts 17 in response to one pulse supplied to the SM1 41 is defined as LPS, and an offset value for correcting an error caused by mounting conditions and sensitivity variations of the STS 32 is defined as OFS, a feed distance Z1 after coincidence between the leading edge 2a of the plate material sheet 2 and the optical axis 15, and the number of pulses M1 to be applied to the SM1 41 for feeding the plate material sheet 2 by the feed distance Z1 are given as follows:

$$Z1 = LM/2 + OFS \tag{2}$$

$$M1 = Z1/LPS \tag{3}$$

As is apparent from the above equations, after the leading edge 2a of the plate material sheet 2 is detected by the STS 32, the pulses given by equation (3) are supplied to the SM1 41 which is then stopped.

Figure 4A:
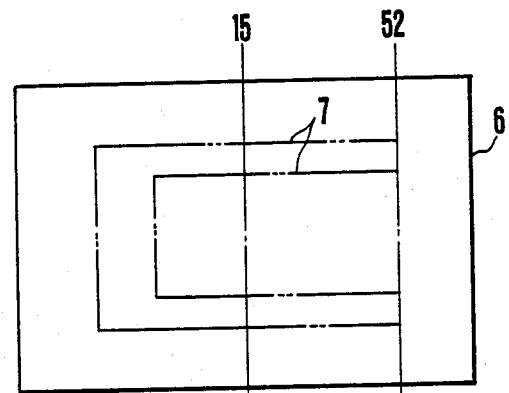
Figure 4B:
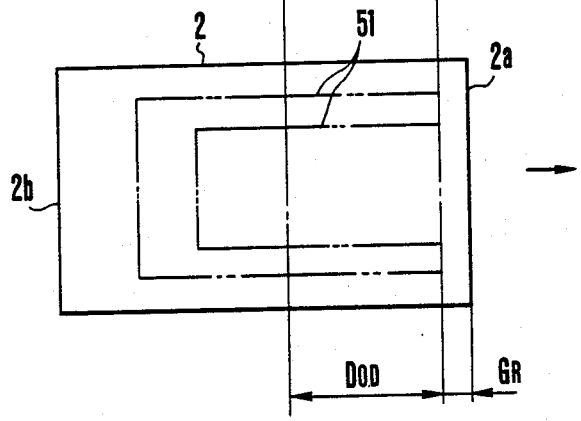

FIGS. 4A and 4B show side exposures wherein a blank portion called a gripper is formed from the leading edge 2a of the plate material sheet 2 and a document image 51 is formed through a gripper width GR. As shown in FIG. 4A, one end of the document 7 is aligned with a reference position 52 on the document table 6. At the same time, as shown in FIG. 4B, after the leading edge 2a of the plate material sheet 2 fed along the direction of the arrow is aligned with the optical axis 15, the plate material sheet 2 is further fed by a distance corresponding to the gripper width GR and the distance DOD between the optical axis 15 and the reference position 52. In this state, the plate material sheet 2 is stopped and is exposured, thereby forming the document image 51 at the desired region.

In this case, after the STS 32 detects the leading end 2a of the plate material sheet 2, the number M1 of pulses supplied to the SM1 41 is calculated as follows:

$$M1 = (DOD + GR + OFS)/LPS \tag{4}$$

Figure 5A:
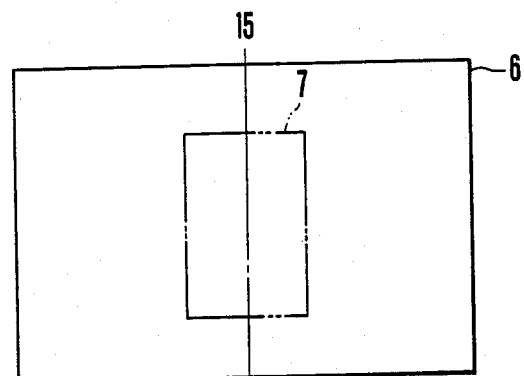
Figure 5B:
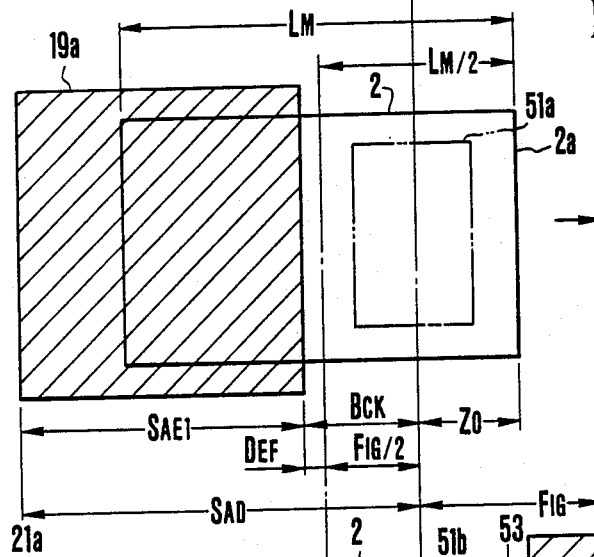
Figure 5C:
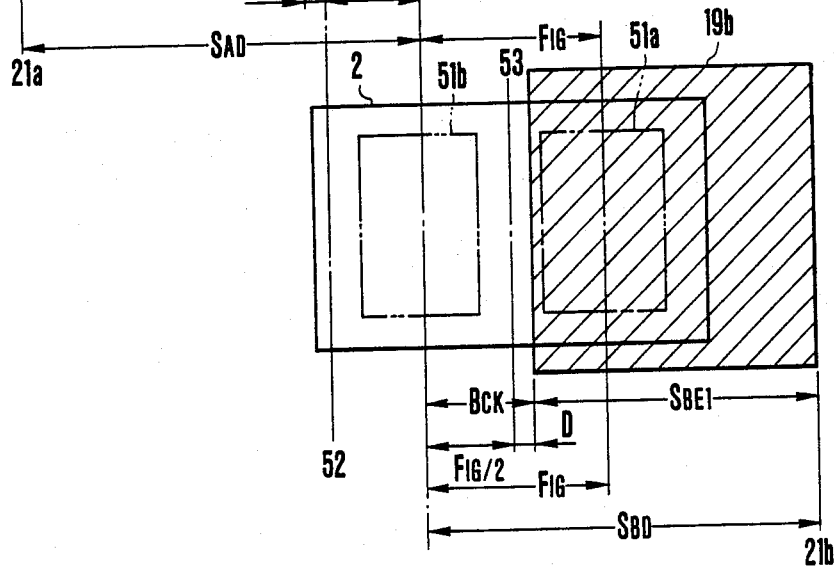

FIGS. 5A to 5C show the same double exposure as in FIGS. 2A and 2B, wherein center 53 of the plate material sheet 2 is used as a reference position and an identical image is repeatedly formed at regions symmetrical about the reference position. As shown in FIG. 5A, the center of the document 7 is aligned with the optical axis 15. At the same time, as shown in FIG. 5B, after the BDA 19a is extended by a length SAE1 with respect to the shaft 21a housing the BDA 19a, the plate material sheet 2 is fed until the position of the plate material sheet 2 which corresponds to the center of a first document image 51a is aligned with the optical axis 15. The plate material sheet 2 is then stopped and subjected to the first exposure operation, thereby forming the first document image 51a.

As shown in FIG. 5C, if a distance between the first document image 51a and a second document image 51b, an overlapping light-shielding prevention width for preventing formation of a color stripe on the developed plate material sheet 2, an extension distance of the BDA 19a in response to one pulse supplied to the SM2 42, and a distance between the shaft 21a and the optical axis 15 are defined as FIG, DEF, LPA and SAD, respectively, a distance BCK between the leading edge of the BDA 19a and the optical axis 15 and the number of pulses SA supplied to the SM2 42 are given as follows:

$$BCK = FIG/2 + DEF \tag{5}$$

$$SA = (SAD - BCK)/LPA \tag{6}$$

A distance Z0 between the leading edge 2a upon stopping of the plate material sheet 2 and the optical axis 15, and the number M1 of pulses supplied to the SM1 41 upon detection of the leading edge 2a by the STS 32 are given as follows:

$$Z0 = LM/2 - FIG/2 + OFS \tag{7}$$
$$= (LM - FIG)/2 + OFS$$

$$M1 = Z0/LPS \tag{8}$$

As shown in FIG. 5C, the BDA 19a returns to the initial position, and at the same time the BDB 19b is extended by the length SBE1 with respect to the shaft 21b housing the BDB 19b. The plate material sheet 2 is further fed by a distance corresponding to FIG and is then subjected to the second exposure operation. As a result, the second document image 51b is formed.

The distance BCK is given by equation (5), and the number SB of pulses to be supplied to the SM3 43 is given as follows:

$$SB = (SBD - BCK)/LPB \tag{9}$$

where SBD is the distance between the shaft 21b and the optical axis 15, and LPB is the extension length of the BDB 19b in response to one pulse supplied to the SM3 43.

In addition, the number M2 of pulses to be supplied to the SM1 41 so as to feed the plate material sheet 2 by the distance FIG is given as follows:

$$M2 = FIG/LPS \tag{10}$$

Figures 6A, 6B, 6C:
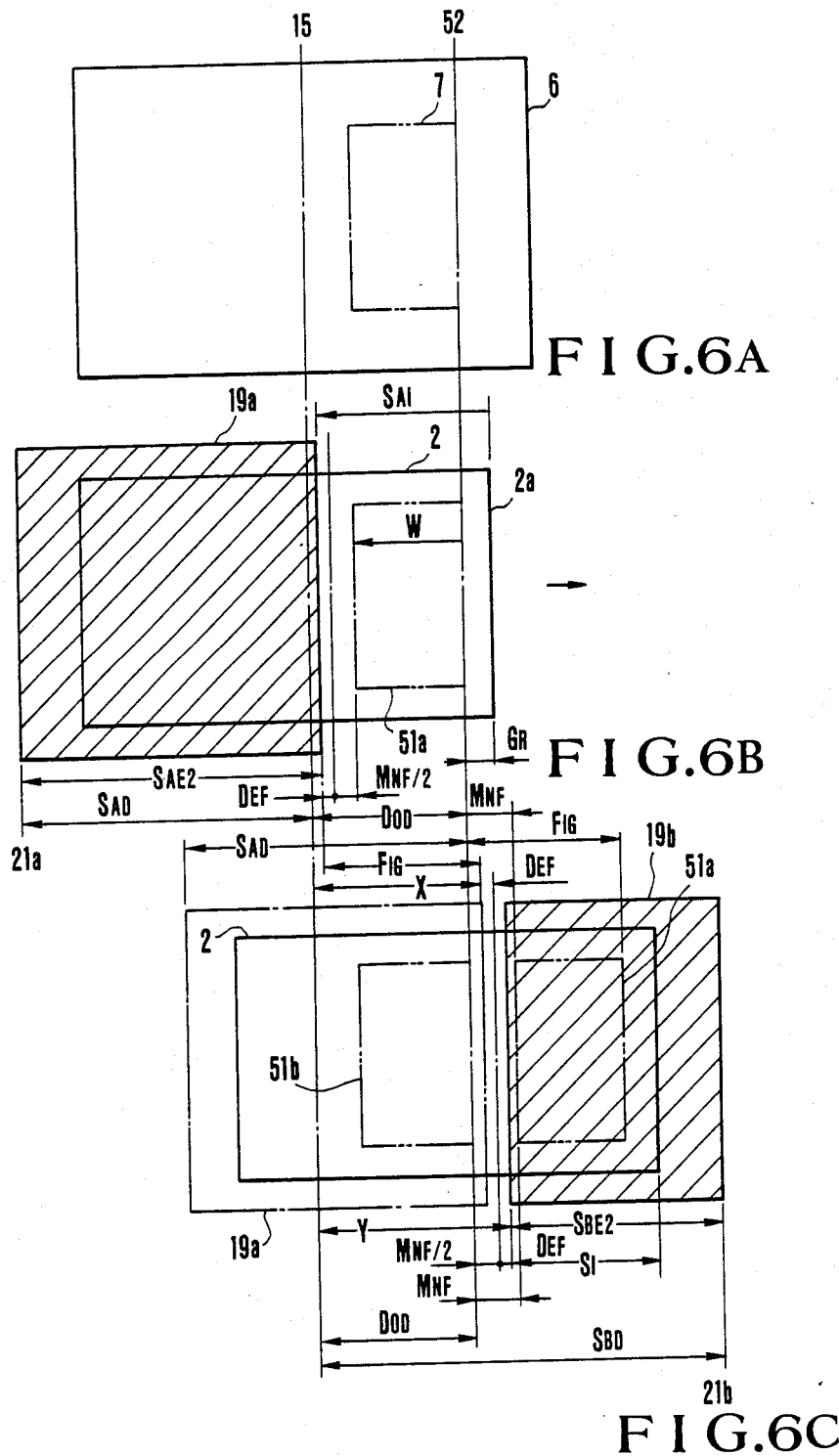

FIGS. 6A to 6C show the same double exposure as in FIGS. 2A and 2B under the same conditions as in FIG. 3A and 3B. As shown in FIG. 6A, one end of the document 7 is aligned with the reference position 52 of the document table. At the same time, as shown in FIG. 6B, the BDA 19a is extended by a length SAE2 with respect to the shaft 21a, and the leading edge 2a of the plate material sheet 2 is aligned with the optical axis 15. Thereafter, the plate material sheet 2 is further fed by a distance corresponding to a sum of a gripper width GR and a distance DOD between the optical axis 15 and the reference position 52. The plate material sheet 2 is stopped and then subjected to the first exposure operation, thereby forming a first document image 51a.

Since a width of the first document image 51a is indefinite, the BDA 19a is represented by an imaginary line of FIG. 6B so as to obtain the extension length SAE2. In this case, if the blank width between the first document image 51a and a second document image 51b is defined as MNF, a distance X between the leading edge of the BDA 19a and the optical axis 15 is given as follows:

$$X = DOD + MNF/2 - DEF \tag{11}$$

Referring to FIGS. 6B and 6C, relative displacement FIG corresponding to the length FIG has occurred and leading edge distances of the shielding curtains are given as FIG, and the number SA of pulses (supplied to the SM2 42) which corresponds to the extension length SAE2 is given as follows:

$$SA = (SAD + X - FIG)/LPA \tag{12}$$

In the same manner as in FIGS. 5A and 5B, the BDA 19a returns to the initial position. At the same time, the BDB 19b is extended by the length SBE2. Thereafter, the plate material sheet 2 is fed by a distance FIG and is then exposed to form the second document image 51b.

A distance Y between the optical axis 15 and the leading edge of the BDB 19b and the number SB of pulses supplied to the SM3 43 in accordance with the extension length SBE2 are given as follows:

$$Y = DOD + MNF/2 + DEF \tag{13}$$

$$SB = (SBD - Y)/LPB \tag{14}$$

The number M2 of pulses supplied to the SM1 41 so as to feed the plate material sheet 2 is given by equation (10).

Errors in LPS, SAD and SBD in equations (3) to (14) occur due to dimensional and mounting errors of the belts 17, rollers looped with the belts 17 and the shafts 21a and 21b. At the same time, the position of the STS 32 is not always aligned completely with the optical axis 15. When the SM1 41, the SM2 42 and the SM3 43 control the movable members such as the plate material sheet 2 and the BDA 19a and the BDB 19b, these errors must be corrected.

In order to correct these errors, test operation must first be performed. Platemaking is performed under specific conditions to obtain actual values corresponding to design values, thereby correcting the calculations given by equations (2) to (4). Even if special mechanism corrections are not performed, the control errors can be fine-adjusted.

Since the value LPS is the basis of the operation, it is convenient to correct the value LPS first. Assume that the value FIG is to be corrected for double exposure. The first and second document images 51a and 51b are formed on the plate material sheet 2 and developed. The distance between the images 51a and 51b is actually measured to obtain an actual value STI, thereby obtaining a corrected value LPS as follows:

$$LPS = STI/M2 \quad (21)$$

where M2 is the number of pulses supplied to the SM1 41 so as to feed the plate material sheet by the distance FIG.

Subsequently, correction is required in association with the position of the STS 32. The side double exposure state in FIGS. 6A to 6B is obtained, and the first and second document images 51a and 51b are formed for GR=0 in the same manner as described above. The distance between the reference position 52 of the image corresponding to the first document image 51a and the leading edge 2a is actually measured to obtain an actual value SCI, thereby calculating the offset value OFS as follows:

$$OFS = SCI - DOB \quad (22)$$

where DOB is the design reference distance value between the optical axis 15 and the STS 32 in accordance with the design specifications.

In order to correct the value SAD of the BDA 19a, the state in FIGS. 6A and 6B is obtained. In this case, assume that the values GR and FIG are to be corrected. The first exposure operation is performed to expose only the portion of the plate material sheet which corresponds to the first document image 51a. The exposed width SAI from the leading edge 2a is actually measured, and a corrected distance SAD is obtained using a design reference value SAS:

$$SAD = SADS + (SAI - SAS) \quad (23)$$

where SADS is the value SAD before correction.

In order to correct the value SBD of the BDB 19b, the state and conditions which are required for the correction mode are set, and the second exposure operation is performed to expose a region of the plate material sheet which corresponds to the second document image 51b. A nonexposed width SBI from the leading edge 2a is actually measured, and a corrected SBD is calculated using a reference value SBS and the value SBDS as the SBD before correction:

$$SBD = SBDS + (SBS - SBI) \quad (24)$$

When the above correction operations are completed, the exposure device is controlled in accordance with the calculations by equations (3) to (14), so that the positions of the respective movable members can be accurately controlled.

Figure 7:
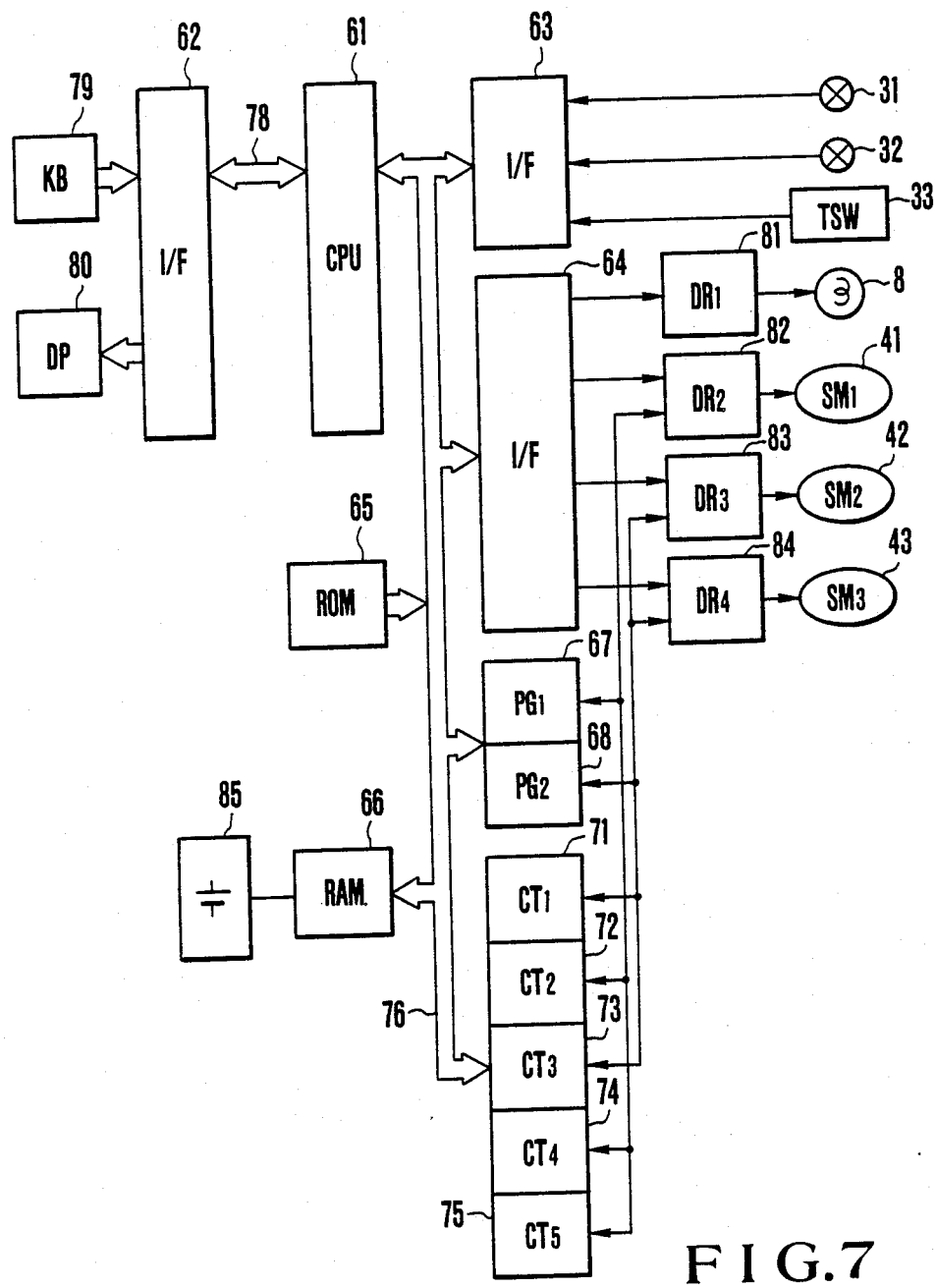

FIG. 7 is a block diagram showing an arrangement of an electric circuit of the exposure device. A processor (to be referred to as a CPU hereinafter) 61 such as a microprocessor as a central unit is connected to interfaces (to be referred to as I/Fs hereinafter) 62 to 64, a ROM (read-only memory) 65, a RAM (random access memory) 66, pulse generators (to be referred to as PG1 and PG2 hereinafter) 67 and 68 comprising frequency dividers, and presettable counters (to be referred to as CT1 to CT5 hereinafter) 71 to 75 through buses 76 and 78. The I/F 62 is connected to a keyboard (to be referred to as a KB hereinafter) 79 and a display (to be referred to as a DP hereinafter) 80 such as a character display.

The I/F 63 is connected to the MLS 31, the STS 32 and a switch (to be referred to as a TSW hereinafter) 33 used for fine adjustment. The TSW 33 sets the exposure device in the correction mode. When correction is completed, the correction mode is automatically cancelled. Unless the correction mode is set by the TSW 33, the input values cannot be updated. The I/F 64 is connected to drivers (to be referred to as DR1 to DR4 hereinafter) 81 to 84 which respectively drive the illumination lamp 8 turned on during exposure and the SM1 41, the SM2 42 and the SM3 43.

The PG1 67 and the PG2 68 divide the frequency of a clock pulse under the control of the CPU 61 and supply drive pulses having predetermined periods to the SM1 41, the SM2 42 and the SM3 43 through the DR2 82, the DR3 83 and the DR4 84. At the same time, the drive pulses are supplied to the counters 71, 72, 73 and 74 which start counting the drive pulses.

The CPU 61 as the control unit executes instructions stored in the ROM 65 and also performs arithmetic and logic operations while necessary data in the RAM 66 is accessed in response to the respective input data through the I/Fs 62 and 63. The CPU 61 sends out control signals through the I/F 64 to control the DR1 81, the DR2 82, the DR3 83 and the DR4 84. The CPU 61 also fetches key input signals from the KB 79 through the I/F 62 and supplies display data to the DP 80.

The CPU 61 presets counts in the CT1 71 to the CT4 74 in response to the input data from the KB 79 and monitors the count-down operation thereof and a count-up operation of a CT5 75. The CPU 61 also controls the start, stop and clear operations of the CT1 71 to the CT5 75. A backup battery 85 is connected to the RAM 66 to hold the contents of the RAM 66 when power is cut off therefrom.

Figure 8A:
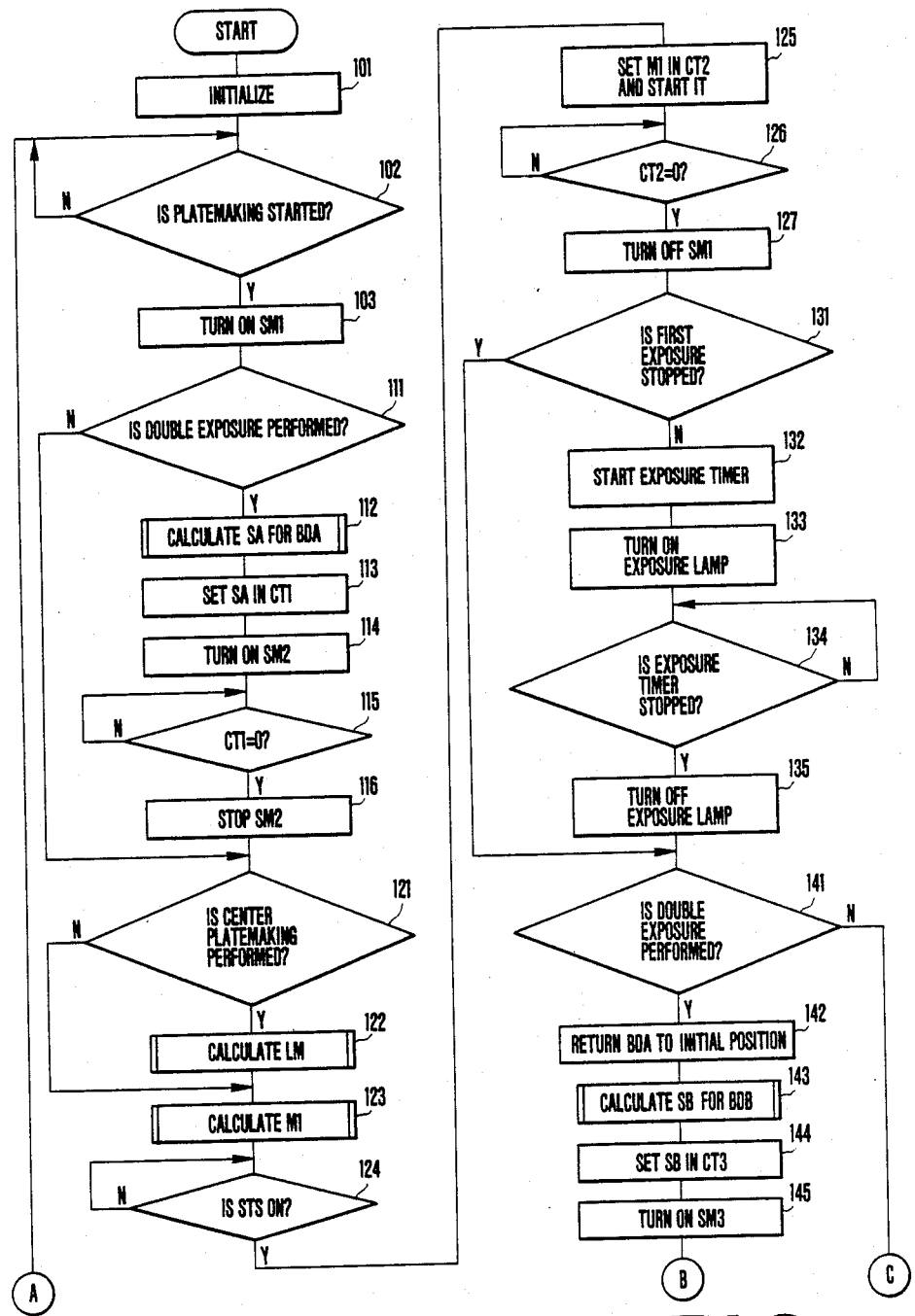
Figure 8B:
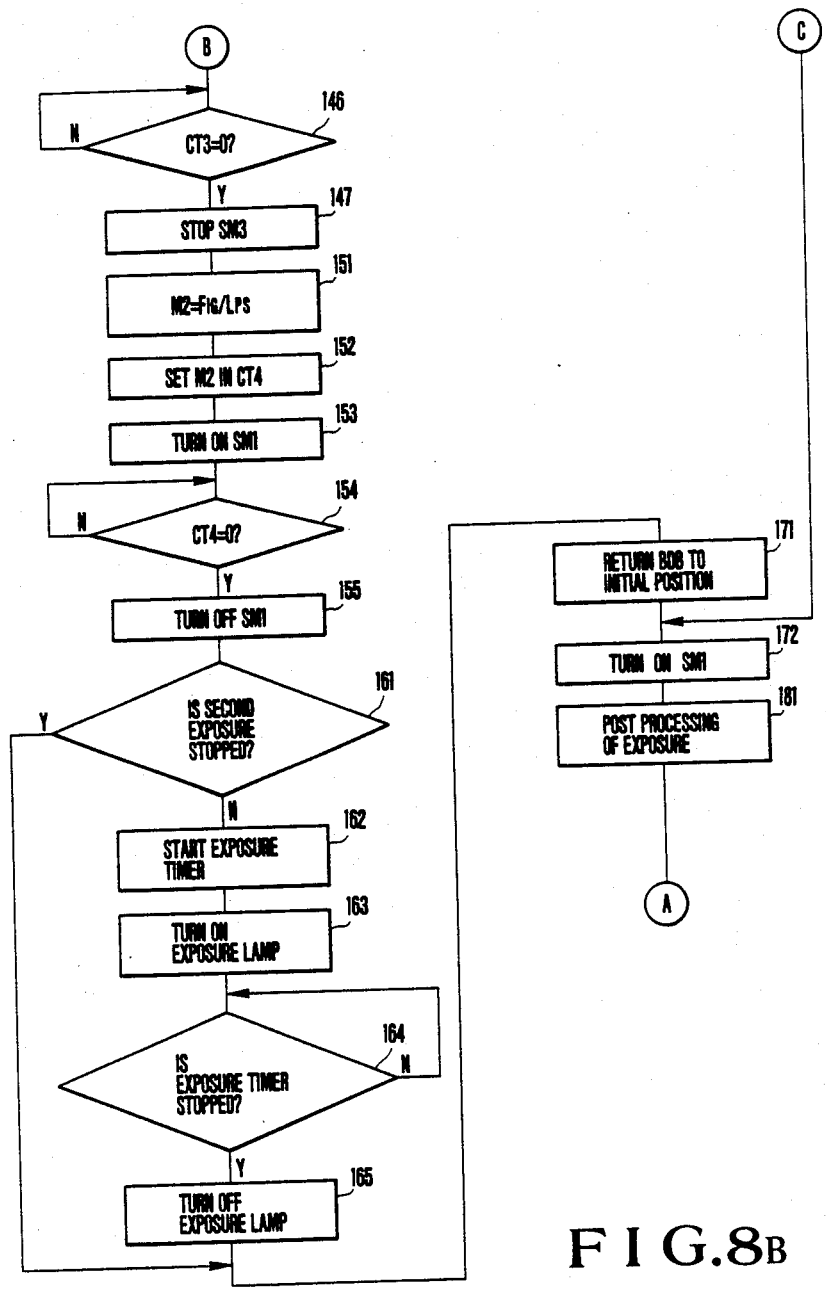

FIGS. 8A and 8B illustrate a flow chart for explaining the control operation of the CPU 61. In step 101, the CPU 61 clears the CT1 71 to the CT5 75. When data (e.g., SADS and SBDS) prior to correction are required, the design values are stored in the ROM 65, and the data prior to correction must be transferred to the RAM 66 during initialization. It should be noted that the above operation is performed only when the RAM 66 is accessed for the first time since the RAM 66 is backed up.

Upon operation of the KB 79, the CPU 61 checks in step 102 whether or not platemaking is started. If Y (YES) in step 102, i.e., when the CPU 61 supplies a platemaking start command, the flow advances to step 103. In step 103, the CPU 61 causes the DR2 82 to supply a pulse to the SM1 41 which is then started. The CPU 61 checks in step 111 in the same manner as in step 102 whether or not double exposure is required. If Y in step 111, the flow advances to step 112. In step 112, the CPU 61 calculates the value SA for the BDA 19a. In step 113, the value SA is set in the CT1 71, and the flow advances to step 114. In step 114, the CPU 61 causes the DR3 83 to supply a pulse to the SM2 42 which is then started. In step 115, the CPU 61 checks whether or not CT1="0" is established. If Y in step 115, i.e., when CPU 61 determines that the count of the CT1 71 is zero, the CPU 61 causes the DR3 83 to DC energize the SM2 42 in step 116, thereby braking and stopping the SM2 42. In this manner, the extension operation of the BDA 19a is completed.

Upon operation of the KB 79, the CPU 61 checks in step 121 whether or not center platemaking is performed. If Y in step 121, i.e., when the CPU 61 determines that this input represents center platemaking, the CPU 61 calculates the overall length LM of the plate material sheet 2 in step 122, and the value M1 is calculated in step 123. If N in step 121, the flow advances to step 123 in which the value M1 is calculated. When the CPU 61 determines in step 124 that the STS 32 detects the leading end 2a of the plate material sheet 2, the CPU 61 sets the value M1 in the CT2 72 in step 125. In step 126, the CPU 61 monitors the count of the CT2 72 and determines that the count is zero (CT2="0"). Under this condition, in step 127, the CPU 61 causes the DR2 82 to stop supplying the pulse to the SM1 41 which is thus stopped. As a result, the plate material sheet 2 is stopped at a predetermined position.

The CPU 61 checks in step 131 whether or not a first exposure inhibit command is generated by the TSW 33 and the KB 79. If NO in step 131, the flow advances to step 132. The CPU 61 causes an internal exposure timer to start in step 132. In step 133, the CPU 61 controls the DR1 81 to turn on the illumination lamp 8, and the exposure operation is performed. The CPU 61 checks in step 134 whether or not a predetermined exposure time has elapsed. If Y in step 134, the CPU 61 controls the DR1 81 to turn off the illumination lamp 8 in step 135.

The CPU 61 checks again in step 141 whether or not the double exposure command is entered. If YES in step 1, the CPU 61 controls the DR3 83 to DC energize the SM2 which is then stopped in step 142, thereby causing the BDA 19a to return to the original position. In step 143, the CPU 61 calculates the value SB for the BDB 19b. The value SB is set in the CT3 73 in step 144. Thereafter, in step 145, the CPU 61 controls the DR4 84 to supply a pulse to the SM3 43 which is then turned on. In step 146, the CPU 61 checks whether or not the count of the CT3 73 is decremented to zero (CT3="0"). If Y in step 146, i.e., when the CPU 61 determines that the count of the CT3 73 is zero, the CPU 61 stops the SM3 43 in step 147. As a result, extension of the BDB 19b is ended.

The flow advances to step 151, and the CPU 61 calculates the value M2 (=FIG/LPS) by equation (10) using the respective data FIG and LPS which are entered at the KB 79 and which are stored in the RAM 66. In step 152, the value M2 is set in the CT4 74. In step 153, the SM1 41 is started again. The CPU 61 monitors in step 154 whether or not the count of the CT4 74 is zero (CT4="0"). If Y in step 154, the SM1 41 is stopped in step 155. The plate material sheet 2 is thus stopped at the second exposure position.

The same exposure operation as in steps 131 to 135 is performed in step 161 (as to whether or not the second exposure inhibit command is generated). If N in step 161, the same operations as in steps 132 to 135 are performed in steps 162 (exposure timer start) to 165 (exposure lamp off). The BDB 19b is returned to the original position in step 171 in the same manner as in step 142. Subsequently, the flow advances to step 172 wherein the DR2 82 is controlled to drive the SM1 41. After the CPU 61 performs the post exposure operations such as development and fixing operations in step 181, the flow returns to step 102, and the above steps are repeated.

Figure 9:
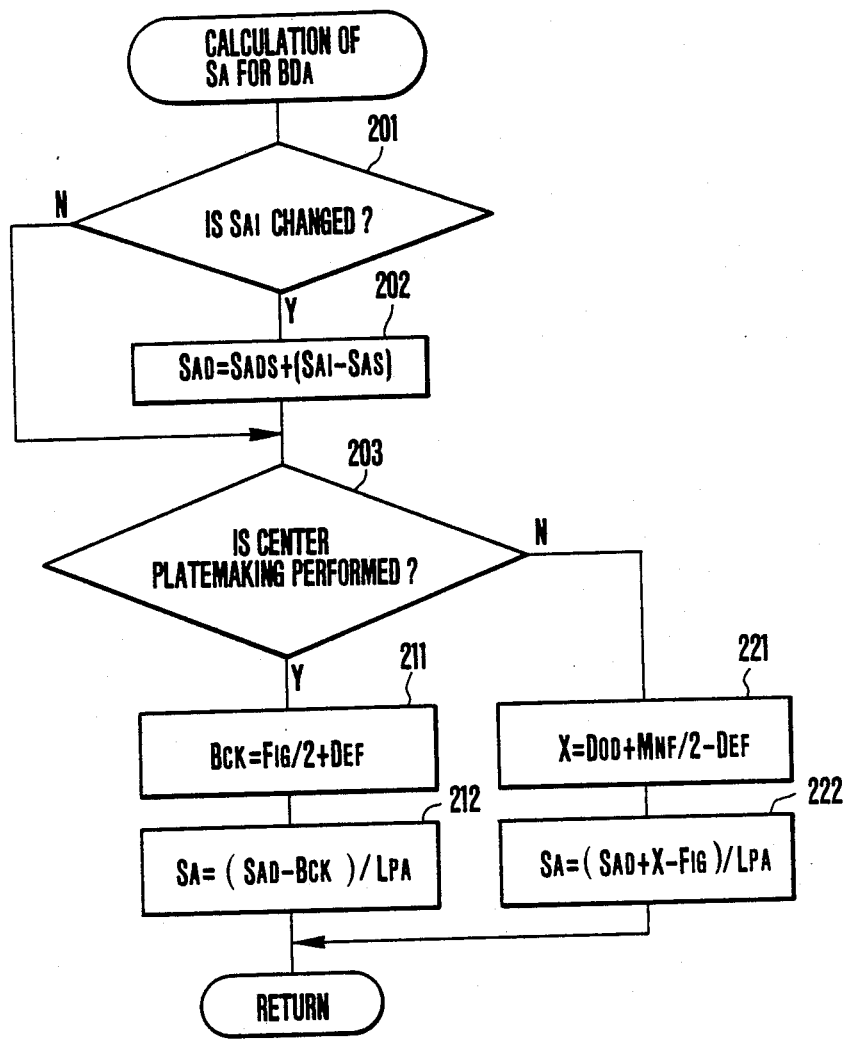

FIG. 9 is a flow chart for explaining the detailed operations of step 112.

FIG. 9 shows the calculation of the value SA for the BDA 19a. In step 201, the CPU 61 compares the old data of the actually measured value SAI with the new data thereof stored in the RAM 66 so as to check whether or not any change has occurred. If Y in step 201, the flow advances to step 202. In step 202, the CPU 61 calculates the value SAD (=SADS+(SAI−SAS)) by equation (23) using the new actually measured value SAI. The CPU 61 checks in step 203 whether or not platemaking is center platemaking. If Y in step 203, the flow advances to steps 211 and 212 to calculate the values BCK (=(FIG/2)+DEF) by equation (5) and SA (=(SAD−BCK)/LPA) by equation (6).

However, if N in step 203, the flow advances to step 221 and 222 wherein the values X (=DOD+(MNF/2) DEF) and SA (=(SAD+X−FIG)/DPA) are calculated by equations (11) and (12), respectively. The calculated value SA is stored in the RAM 66.

It should be noted that the values SADS and LPA are prestored in the RAM 66, the values SAS, DEF, DOD and MNF are prestored in the ROM 65 and the values SAI and FIG are entered at the KB 79 and stored in the RAM 66.

Figure 10:
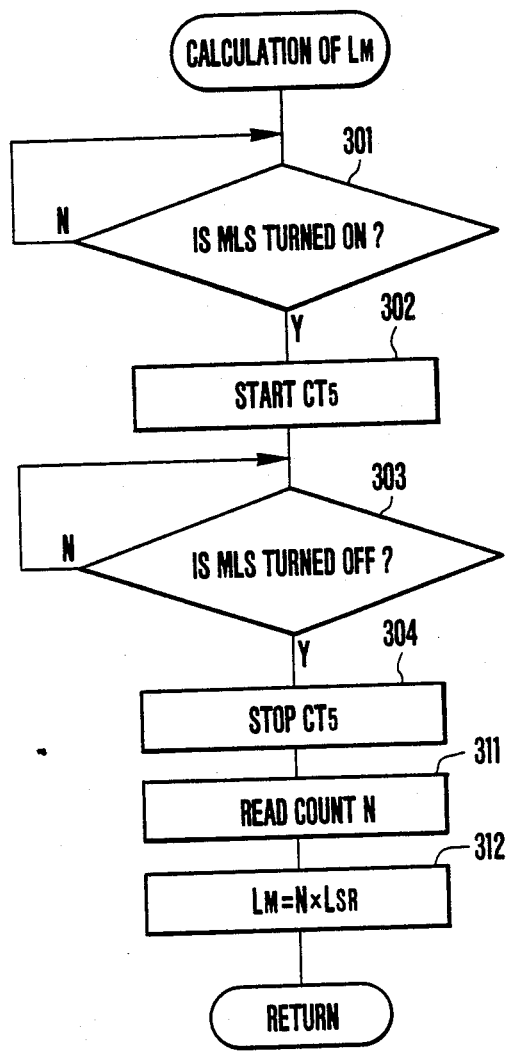

FIG. 10 is a flow chart for explaining in detail step 122, i.e., calculation of the overall length LM of the plate material sheet. In step 301, the MLS 31 detects the leading edge 2a of the plate material sheet and is turned on. In response to the ON operation of the MLS 31, the CPU 61 causes the CT5 75 to start in step 302. When the CT5 75 counts up the pulses supplied to the SM1 41 and the CPU 61 detects in step 303 that the plate material sheet 2 has passed by the MLS 31, the CPU 61 checks in step 303 whether or not the MLS 31 is turned off. If YES in step 303, in step 304, the CPU 61 stops the operation of the CT5 75. In step 311, the CPU 61 reads in the count of the CT5 75. In step 312, the CPU 61 performs the calculation by equation (1), i.e., LM=N×LSR, to obtain the value LM. The resultant value LM is stored in the RAM 66.

It should be noted that the data stored in the RAM 66 is used as LSR.

Figure 11:
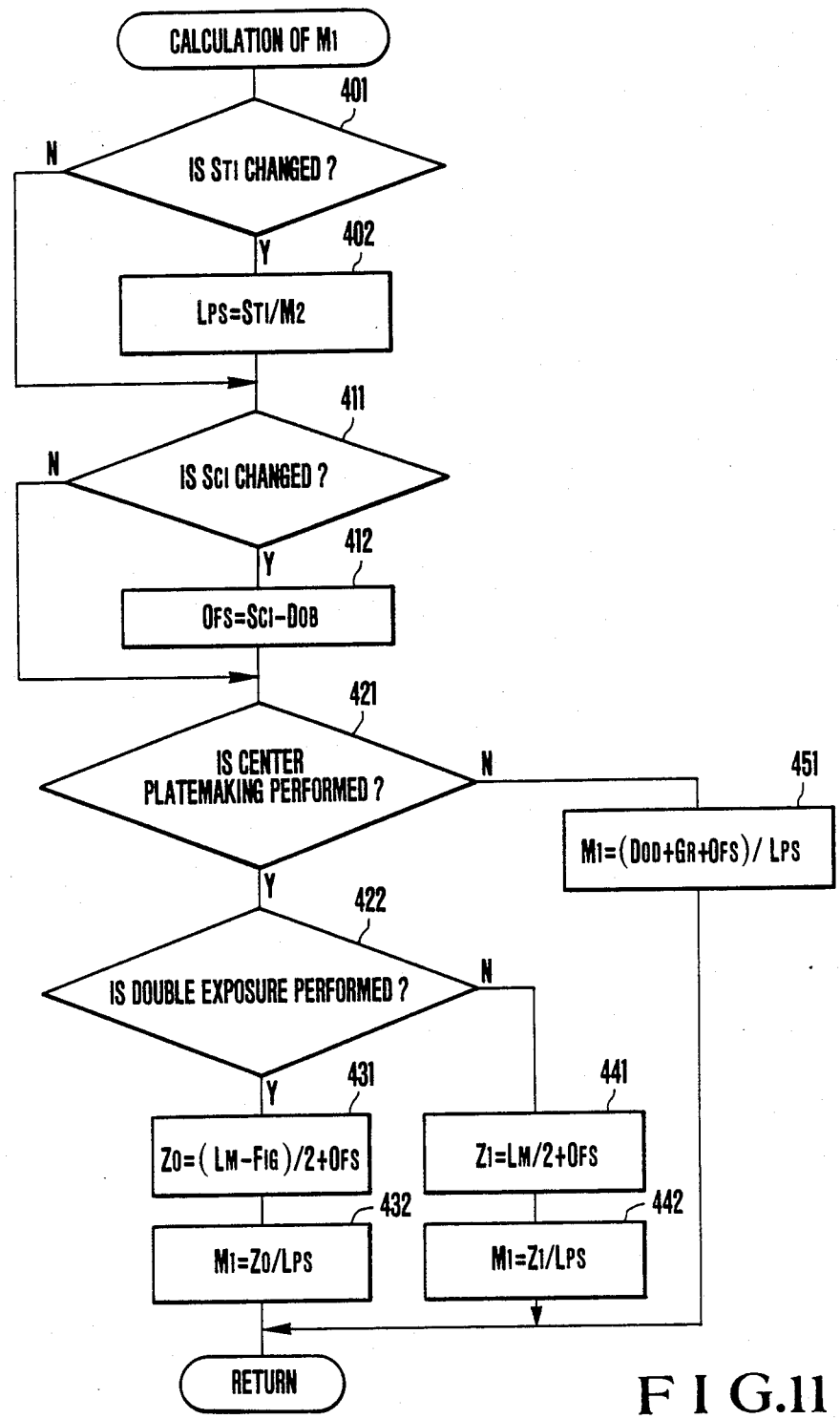

FIG. 11 is a flow chart for explaining operations of step 123 in detail. In step 401, the CPU 61 checks whether or not a change occurs in the actually measured value STI stored in the RAM 66 and obtained by a correction operation (to be described later). If Y in step 401, the CPU 61 calculates the value LPS (=STI/M2) by equation (21) using the new STI value in step 402. In step 411, the CPU 61 checks a change in the actually measured value SCI. If Y in step 411, the value OFS (=SCI−DOB) is calculated by equation (22) using the new SCI value in step 412.

The CPU checks in steps 421 and 422 whether or not platemaking is center platemaking in the same manner as in step 121 and the exposure is the double exposure in the same manner as in step 111. If Y in steps 421 and 422, the flow advances to steps 431 and 432 wherein the values Z0 (=(LM−FIG)/2+OFS) and M1 (=Z0/LPS) are calculated by equations (7) and (8), respectively. However, if NO in step 422, the CPU 61 calculates the values Z1 (=(LM/2)+OFS) and M1 (=Z1/LPS) by equations (−2) and (3) in steps 441 and 442, respectively. If N in step 421, the value M1 (=(DOD+GR+OFS)/LPS) is calculated by equation (4) in step 451. The respective values M1 are stored in the RAM 66.

It should be noted that the values M2, LM and LPS are prestored in the RAM 66, the values DOB and DOD are prestored in the ROM 65, and the values STI, SCI, FIG and GR are entered at the KB 79 and stored in the RAM 66.

Figure 12:
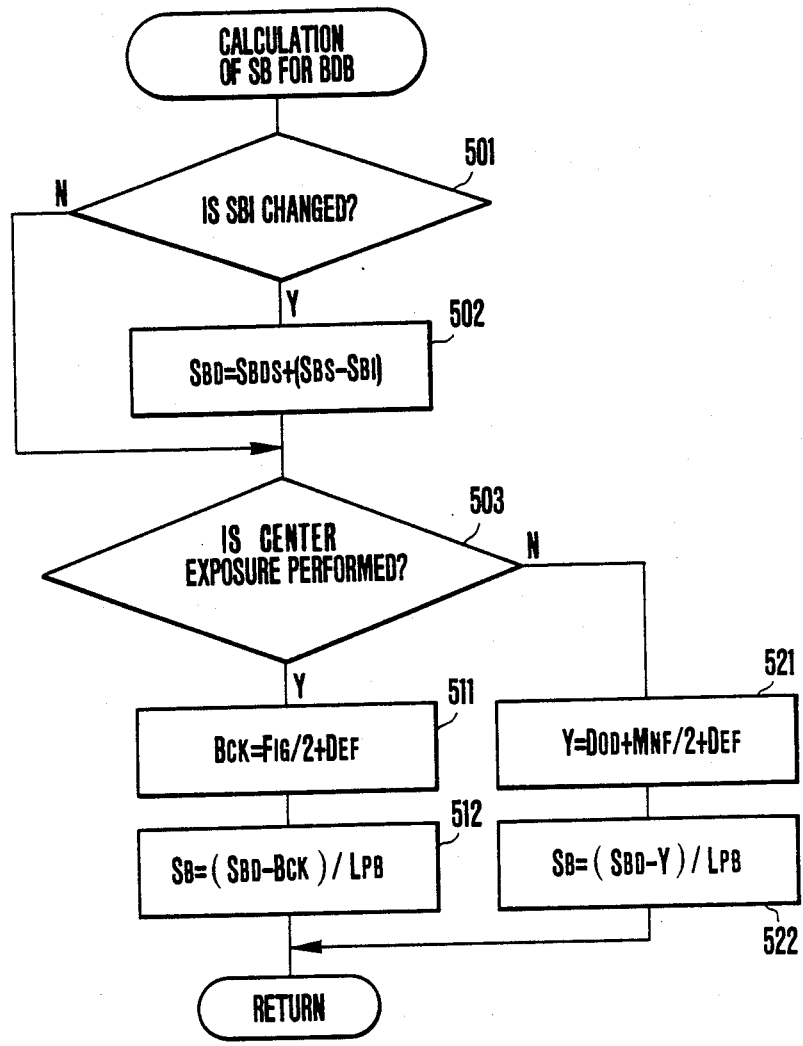

FIG. 12 is a flow chart for explaining in detail step 143 for calculating the value SB for the BDB 19b. In step 501, the CPU 61 compares the old actually measured value SBI with the new actually measured value SBI so as to check whether or not a change in the value has occurred. If Y in step 501, the value SBD (=SBDS+(SBS−SBI)) is calculated by equation (24) using the new SBI value in step 502. The CPU 61 checks in step 503 whether or not platemaking is center platemaking. If Y in step 503, the values BCK (=(FIG/2)+DEF) and SB (=(SBD−BCK)/LPB) are calculated by equations (5) and (9) in steps 511 and 512, respectively. However, if N in step 503, the values Y (=DOD+(MNF/2)+DEF) and SB (=(SBD−Y)/LPB) are calculated by equations (13) and (14) in steps 521 and 522, respectively. The resultant values SB are stored in the RAM 66. In this case, the status of data stored in the RAM 66 is the same as that of FIG. 9.

Figure 13:
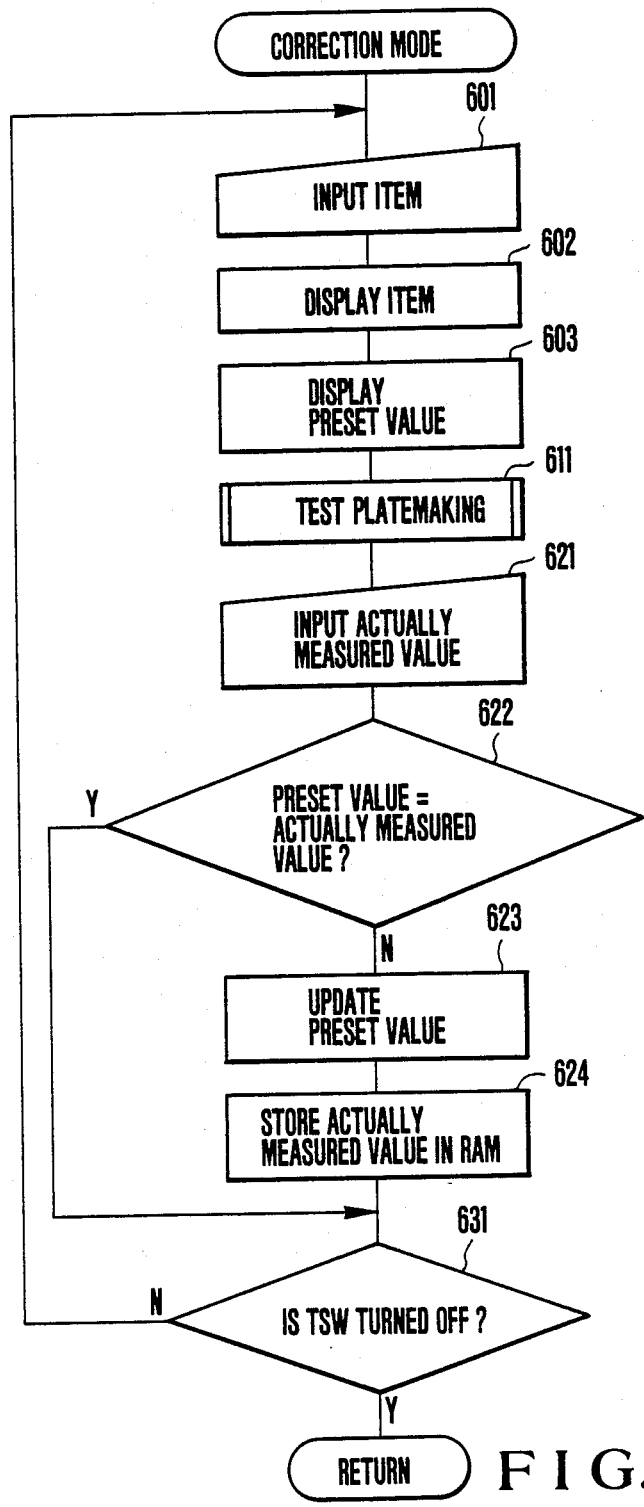

FIG. 13 is a flow chart for explaining correction of the actually measured value. When the TSW 33 is turned on, the correction mode is set. When an item is selected by a selection key in the KB 79 in step 601, the input item is displayed as a code on the DP 80 in step 602. In step 603, the preset value corresponding to this item is read out from the RAM 66 and is displayed on the DP 80.

In step 611, test platemaking is performed in accordance with the procedures described with reference to FIGS. 8, thereby measuring an actually measured value corresponding to the preset value. When the operator enters the actually measured value with numeric keys on the KB 79 in step 621, the input data is compared with the corresponding data stored in the RAM in step 622 so as to determine whether or not condition "preset value=actually measured value" is established. If Y in step 622, the display in step 603 is updated to the actually measured value display in step 623. The actually measured value is stored in the RAM in step 624. When the CPU 61 determines in step 631 that the TSW 33 is not turned off, the flow returns to step 601 and the above operations are repeated.

A correction range of the value LPS falls within 2860 m/m to 3060 m/m (0.1 m/m per step) upon presetting of the code STP. The position correction range of the STS 32 falls within 0 to 400 m/m (0.1 m/m per step) upon presetting of the code CNT. The correction ranges of the value LPA and LPB fall within 189 to 199 m/m and 185 to 195 m/m (1.0 m/m per step) upon presetting of the codes SDU and SDD, respectively.

When the preset value coincides with the actually measured value, step 621 can be omitted.

The positional adjustment of the STS 32 is performed by calculating a positive or negative variation with respect to a central value derived from the actually measured value. For this reason, "+" and "−" keys are omitted from the KB 79. In addition, since the preset values are displayed on the DP 80, these can be used as reference values.

Mechanical errors can be easily corrected, and a special correction switch or the like need not be used, thereby simplifying the overall configuration and improving positional precision.

Exposure portion control for the plate material sheet 2 can be accurate. Even if a dimensional error occurs in the plate material sheets 2, the document image can be formed on the desired region, and double exposure can be accurately and easily performed. Scattered light components will not be irradiated on the plate due to the presence of the BDA 19a and the BDB 19b, so that a plate with good contrast can be obtained at high speed.

However, if an error occurs in the size of the roller 14, an error in the overall length LM of the plate material sheet 2 occurs. For this reason, the roller 14 is tooled with high precision to prevent the error. The dimensional error of the roller 14 can be corrected in the same manner as described above.

In the above embodiment, the MLS 31 and the STS 32 comprise photoelectric sensors, respectively, but may be of another type. The BDA 19a and the BDB 19b may be replaced with a single curtain. In this case, the single curtain may be moved along the peripheral portion of the exposure unit 5 and may be stopped at a predetermined position so as to perform masking, thereby obtaining the same effect as in the above embodiment. Furthermore, a combination of different logic circuits may be used in place of the CPU 61. The PG1 67 and the PG2 68 and the CT1 71 to the CT5 75 may be replaced with software.

Referring to FIGS. 8 to 13, various modifications may be made. For example, the step order may be rearranged, and unnecessary steps may be omitted.

First, according to the present invention as described above, since the actual length of the plate material sheet is measured to arbitrarily set a reference position for image formation, the image can be formed with respect to the reference position. In addition, a plurality of images can be formed with respect to any reference position. Plate material sheets having different sizes can be used, so that the present invention can be applied to any type of printing press from a compact press to a large press.

In this manner, since the image is accurately formed with reference to the reference position, an image position error need not be considered when the corresponding plate is mounted on the plate cylinder, thus providing an advantage in printing.

Second, according to the present invention, dimensional and mounting errors of mechanism members and errors of the optical system can be digitally corrected on the basis of the actually measured values and the corresponding reference values. These errors can be automatically corrected to shorten the adjustment time and improve adjustment precision. In addition, manufacturing errors of mechanism members can be completely eliminated.

What is claimed is:

1. A method of controlling a position of a plate material sheet in a platemaking machine for feeding the plate material sheet by a belt in an exposure region and forming a document image on the plate material sheet, comprising the steps of:

causing a plate material sheet length sensor to detect that the plate material sheet to be fed by a roller to the exposure region has passed by said sensor;

calculating an overall length of the plate material sheet in accordance with the number of pulses supplied to a plate material sheet drive motor while said plate material sheet length sensor generates an output;

calculating from the result obtained in the preceding calculating step a first predetermined number of pulses to be supplied to said plate material sheet drive motor so as to feed the plate material sheet by a first predetermined length within the exposure region;

causing a stop sensor to detect a front edge of the plate material sheet, said stop sensor being arranged such that a center thereof is aligned with the axis of the optical system; and supplying the first predetermined number of pulses to said plate material sheet drive motor after said stop sensor generates an output, thereby aligning a center of a first portion of the plate material sheet with the axis of the optical system.

2. A method according to claim 1, wherein, for single center exposure, the step of calculating the overall length LM of said plate material sheet and the step of calculating the first predetermined number M1 of pulses are performed in accordance with the following relationships:

$$LM = N \times LSR$$

$$Z1 = LM/2 + OFS$$

$$M1 = Z1/LPS$$

where
Z1: the first predetermined length to feed said plate material sheet after the leading edge thereof is aligned with the axis of the optical system;
N: the number of pulses supplied to said plate material sheet drive motor while said plate material sheet length sensor generates the output;
LPS: a distance for which the plate material sheet is fed by a belt for one pulse supplied to said plate material sheet drive motor;
OFS: an offset value for correcting sensitivity and mounting errors of said stop sensor; and
LSR: a distance for which the plate material sheet is fed by the roller for one pulse supplied to said plate material sheet drive motor.

3. A method according to claim 1, wherein, for single side exposure, the first predetermined distance comprises a gripper width and a distance between the optical axis and a reference position; and wherein the step of calculating the first predetermined number M1 of pulses is poerformed in accordance with the following relationship:

$$M1 = (DOD + GR + OFS)/LPS$$

where
DOD: the distance between the optical axis and the reference position;
GR: the gripper width;
OFS: an offset value for correcting sensitivity and mounting error of said stop sensor; and
LPS: a distance by which the plate material sheet is fed by a belt for one pulse supplied to said plate material sheet drive motor.

4. A method according to claim 1, further comprising the steps of:
calculating a second predetermined distance between a leading edge of a first light-shielding curtain and the axis of the optical system and a second predetermined number of pulses supplied to a first shielding curtain drive motor, and supplying the second predetermined number of pulses to said first shielding curtain motor to move said first light-shielding curtain by the second predetermined distance, while a first exposure operation is performed to form a first image;

calculating a third predetermined distance between a leading edge of a second light-shield curtain and the axis of the optical system and a third predetermined number of pulses supplied to a second shielding curtain drive motor to cover the first portion of the plate material sheet for a second exposure and a fourth predetermined number of pulses supplied to said plate material sheet drive motor so as to align a center of a second portion of the plate material sheet with the axis of the optical system so as to perform the second exposure for forming a second image.

5. A method according to claim 4, wherein, for double center exposure, the second and third predetermined distanced BCK are equal; and wherein the steps of calculating said second and third predetermined distances BCK, the second predetermimed number SA of pulses, the first predetermined number M1 of pulses, the third predetermined number SB of pulses and the fourth predetermined number M2 of pulses are performed in accordance with the following relationships:

$$BCK = FIG/2 + DEF$$

$$SA = (SAD - BCK)/LPA$$

$$M1 = Z0/LPS \text{ for } Z0 = LM/2 - FIG/2 + OFS$$

$$SB = (SBD = BCK)/LPB$$

$$M2 = FIG/LPS$$

where
FIG: the distance between centers of the first and second images;
DEF: an overlapping light-shielding preventive width;
SAD: a distance between a shaft for winding said first light-shielding curtain and the axis of the optical system;
LPA: an extension length of said first light-shielding curtain for one pulse supplied to said first shielding curtain drive motor;
Z0: a distance between the leading edge of the plate material sheet and the axis of the optical system;
LPAS: a distance for which the plate material sheet is fed by a belt for one pulse supplied to said plate material sheet drive motor;
LM: the overall length of the plate material sheet;
OFS: an offset value for correcting sensitivity and mounting errors of said stop sensor;
SBD: a distance between a shaft for windingsaid second light shielding curtain and the axis of the optical system; and
LPB: an extension length of said second light-shielding curtain for one pulse supplied to said second shielding curtain drive motor.

6. A method according to claim 4, wherein, for double side exposure, the steps of calculating the second predetermined distance X, the second predetermined number SA of pulses, the first predetermined number M1 of pulses, the third predetermined distance Y, the third predetermined number SB of pulses and the fourth predetermined number M2 of pulses are performed in accordance with the following relationships:

$$X = DOD + MNF/2 - DEF$$

$$SA = (SAD + X - FIG)/LPA$$

$$M1 = (DOD + GR + OFS)/LPS$$

$$Y = DOD + MNF/2 + DEF$$

$$SB = (SBD - Y)/LPB$$

$$M2 = FIG/LPS$$

where
- DOD: the distance between the optical axis and the reference position;
- MNF: a margin between the first and second images;
- SAD: a distance between a shaft for winding said first light-shielding curtain anc the axis of the optical system;
- FIG: a distance between centers of the first and second images;
- LPA: an extension length of said first light-shielding curtain for one pulse supplied to said first shielding curtain drive motor;
- GR: the gripper width; tivity and mounting
- OFS: an offset value for correcting sensi errors of said stop sensor; sheet is fed
- LPS: a distance for which the plate material by a belt for one pulse supplied to said plate material sheet drive motor;
- DEF: an overlapping light-shielding preventive width;
- SBD: a distance between a shaft for winding said second light-shielding curtain and the axis of the optical system;
- LPB: an extension length of said second light-shielding curtain for one pulse supplied to said second shielding curtain drive motor.

7. A method of controling mechanical errors in a platemaking machine for double exposure, comprsing the steps of:
   setting reference data OFS which is an offset value for correcting sensitivity and mounting errors in a stop sensor, LPS which is a distance for which a plate material sheet drive motor, SAD which is a distance between a shaft for winding a first light-shielding curtain and an axis of the optical system, and SBD which is a distance between a shaft for widing a second light-shielding curtain and the axis of th optical system, in a control circuit in the platemaking machine to actuate the platemaking machine in accordance with the reference data;
   obtaining actually measured values corresponding to the reference data in accordance with a plate manufactured upon actuation of the platemaking machine;
   entering the actuallly measured values in the control circuit and comparing the actually measured values with the reference data; and
   updating the reference data in accordance with the comparison operation when errors in respective referecne data occur, by correcting the respective errors as follows:

$$LPS = STI/M2$$

$$OPS = SCI - DOB$$

$$SAD = SADS + (SAI - SAS)$$

$$SBD = SBDS + (SBS - SBI)$$

where
- STI: an actually measured value representing a distance between first and second images;
- M2: the number of pulses supplied to said plate material sheet drive motor so as to form the second image;
- SCI: an actually measured value representing a distance between a leading edge of the plate material sheet and a reference position for the first image;
- DOB: a reference value representing a distance between the axis of the optical system and a stop sensor;
- SADS: an SAD value before correction;
- SAI: an exposure range width from the leading edge of the plate material sheet for the first image;
- SAS: a standard SAD value for the first image;
- SBDS: an SAD value before correction;
- SBI: an exposure range width for the second image.

* * * * *